United States Patent
Klose

(10) Patent No.: US 10,547,958 B2
(45) Date of Patent: Jan. 28, 2020

(54) SOUND REPRODUCTION DEVICE, METHOD FOR ADAPTING A SOUND REPRODUCTION DEVICE, DIVING GOGGLES, AND COMMUNICATION DEVICE

(71) Applicant: Peiker Acustic GmbH & Co. KG, Friedrichsdorf (DE)

(72) Inventor: Michael Klose, Friedrichsdorf (DE)

(73) Assignee: Peiker Acustic GmbH & Co. KG, Friedrichsdorf (DE)

( * ) Notice: Subject to any disclaimer, the term of this patent is extended or adjusted under 35 U.S.C. 154(b) by 0 days.

(21) Appl. No.: 15/963,127

(22) Filed: Apr. 26, 2018

(65) Prior Publication Data

US 2018/0343530 A1    Nov. 29, 2018

Related U.S. Application Data

(63) Continuation of application No. PCT/EP2016/072908, filed on Sep. 27, 2016.

(30) Foreign Application Priority Data

Oct. 30, 2015   (DE) .......................... 10 2015 118 588

(51) Int. Cl.
  H04R 29/00    (2006.01)
  B63C 11/26    (2006.01)
  (Continued)

(52) U.S. Cl.
  CPC ............ H04R 29/001 (2013.01); B63C 11/12 (2013.01); B63C 11/26 (2013.01); G01R 27/16 (2013.01); H04R 7/04 (2013.01)

(58) Field of Classification Search
  CPC ........ H04R 29/001; H04R 7/04; G01R 27/16; H04B 11/00; H04B 13/02; B63C 11/12; B63C 11/26
  (Continued)

(56) References Cited

U.S. PATENT DOCUMENTS 5,400,406 A  *  3/1995  Heline, Jr. ............. G01R 27/02
                                                            381/58
6,370,252 B1    4/2002  Lünter
  (Continued)

FOREIGN PATENT DOCUMENTS

DE        158 019 A1    12/1982
DE       44 23 362 A1    1/1995
  (Continued)

OTHER PUBLICATIONS

English translation of International Preliminary Report on Patentability (Chapter 1) (Application No. PCT/EP2016/072908) dated May 11, 2018, 7 pages.
  (Continued)

Primary Examiner — Paul Kim
(74) Attorney, Agent, or Firm — Burr & Brown, PLLC

(57) ABSTRACT

The invention relates to a sound reproduction device which comprises a signal source, a power source, an amplifier, and a loudspeaker. The sound reproduction device further comprises an impedance measuring device and an analysis device. The impedance measuring device is connected to loudspeaker leads of the loudspeaker in order to measure impedance values, and the impedance measuring device is connected to the analysis device in order to forward the measurement results. The analysis device is also connected to the signal source and/or to the amplifier in order to adapt a signal fed to the loudspeaker.

6 Claims, 3 Drawing Sheets

(51) Int. Cl.
  *B63C 11/12* (2006.01)
  *G01R 27/16* (2006.01)
  *H04R 7/04* (2006.01)

(58) Field of Classification Search
  USPC .......................................................... 381/59
  See application file for complete search history.

(56) References Cited

U.S. PATENT DOCUMENTS

| | | |
|---|---|---|
| 8,354,924 B1 | 1/2013 | Goodwin |
| 2008/0192114 A1* | 8/2008 | Pearson ................. G03B 17/08 348/81 |
| 2010/0045928 A1 | 2/2010 | Levy |
| 2011/0033064 A1 | 2/2011 | Johnson et al. |
| 2013/0329898 A1 | 12/2013 | Williams et al. |
| 2015/0155839 A1 | 6/2015 | Buono et al. |

FOREIGN PATENT DOCUMENTS

| | | |
|---|---|---|
| DE | 195 13 066 A1 | 10/1996 |
| DE | 10 2009 041 999 A1 | 3/2010 |
| JP | H03-068226 A1 | 3/1991 |
| WO | 2013/183147 A1 | 12/2013 |

OTHER PUBLICATIONS

German Search Report (Application No. 10 2015 118 588.1) dated Jun. 14, 2016.
International Search Report and Written Opinion (Application No. PCT/EP2016/072908) dated Dec. 2, 2016.

* cited by examiner

SOUND REPRODUCTION DEVICE, METHOD FOR ADAPTING A SOUND REPRODUCTION DEVICE, DIVING GOGGLES, AND COMMUNICATION DEVICE

CROSS REFERENCE TO RELATED APPLICATIONS

This application is a continuation of International Application No. PCT/EP2016/072908 filed Sep. 27, 2016, which designated the United States, and claims the benefit under 35 USC § 119(a)-(d) of German Application No. 10 2015 118 588.1 filed Oct. 30, 2015, the entireties of which are incorporated herein by reference.

FIELD OF THE INVENTION

The present invention relates to a sound reproduction device, a method for adapting a sound reproduction device, a pair of diving goggles and a communication device.

BACKGROUND OF THE INVENTION

Document DD 158 019 A1 discloses a listening/speaking set for casual divers. In this case, the set consists of an earpiece and a body contact microphone, which are integrated in an elastic, waterproof and functionally designed molded part such that the earpiece is located directly in front of the ear and the contact microphone is located on the neck next to the larynx. A disadvantage of such a set is that the earpiece must be positioned directly in front of the ear in a waterproofed manner.

Furthermore, from JPH 0368226 A, underwater communications equipment which operates by ultrasound is known.

SUMMARY OF THE INVENTION

The object of the present invention is to propose a sound reproduction device and/or a method for adapting a sound reproduction device and/or a pair of diving goggles and/or a communication device, with which a loudspeaker can be operated in a simple way in different media, in such a way that a consistent listening experience is ensured in spite of a change of medium, although the loudspeaker is not placed directly in front of the ear or sealed in a waterproofed manner.

In a sound reproduction device according to the present invention, which comprises a signal source, a power source, an amplifier and a loudspeaker, it is provided that the sound reproduction device further comprises an impedance measuring device and an analysis device, wherein the impedance measuring device is connected to loudspeaker leads of the loudspeaker in order to measure impedance values, and the impedance measuring device is connected to the analysis device in order to forward the measurement results, and the analysis device is connected to the signal source and/or to the amplifier in order to adapt a signal fed to the loudspeaker. On the basis of the impedance values measured by the impedance measuring device, it is possible by means of the analysis device to determine at any time, on the basis of a characteristic change in the impedance values, whether the loudspeaker of the sound reproduction device is being operated in the medium of air or the medium of water, and then to supply the loudspeaker with signals that are adapted to the respective medium. This means it is possible to ensure a consistent listening experience for a user regardless of the medium in which he/she is located. Therefore, when changing from one medium into the other, the user also does not have to perform any manual adjustment of the audio settings.

Provision is also made for equipping the sound reproduction device with a series resistance, wherein when measuring impedance values with the impedance measuring device the series resistor is connected upstream of the loudspeaker. This allows impedance values to be accurately measured by means of a relative measurement.

It is also provided to equip the sound reproduction device with a tone generator, wherein audio signals can be generated by the tone generator and transmitted to the loudspeaker. On the basis of this audio signal, it is possible to perform selective measurements with the impedance measuring device. Provided that reference values relating to these measurements are stored in the analysis device, the respective medium can thus be determined particularly quickly and reliably.

In addition, it is possible to control or regulate the tone generator by the analysis device or the impedance measuring device. Thus, audio signals can be activated as required by the components which exercise the control over the signal source and/or the amplifier.

It is also provided to allow a diaphragm of the speaker of the sound reproduction device to be bounded on both sides by the medium of water when under water and to be bounded on both sides by the medium of air when above water. This avoids the need to take into account boundary layers in the choice of audio settings, so that the choice of appropriate audio properties is simplified.

The method according to the present invention for adapting a sound reproduction device which comprises a signal source, a power source, an amplifier and a loudspeaker, to different environmental media such as, in particular, air and water, provides for:

performing a measurement of at least one impedance value of the loudspeaker using an impedance measuring device;

forwarding the measurement result to an analysis device;

determining the medium in which the loudspeaker is located from the measurement result by means of the evaluation device; and controlling the signal source and/or the amplifier by the analysis device in such a way that parameters, such as playback volume and/or frequency response, can be adapted to the detected medium in such a way as to ensure a consistent listening experience for a user, regardless of the medium in which the loudspeaker is operated.

On the basis of the impedance values measured by the impedance measuring device, it is possible by means of the analysis device to determine at any time, on the basis of a characteristic change in the impedance values, whether the loudspeaker of the sound reproduction device is being operated in the medium of air or the medium of water, and then to supply the loudspeaker with signals that are adapted to the respective medium. It is thereby possible to ensure a consistent listening experience for a user regardless of the medium in which he/she is located. Therefore, when changing from one medium into the other the user also does not have to perform any manual adjustment of the audio settings.

Provision is made either to measure impedance values with the impedance measuring device continuously, or to measure the impedance values at intervals, or to measure impedance values with the impedance measuring device in an event-driven manner. A continuous measurement has the advantage that a reconfiguration of the audio settings can be performed with minimal delay. This means that these can then be converted, for example, when jumping into the water, virtually at the same time as the immersion in the water. Measurement at intervals has the advantage of enabling the sound reproduction device to be operated in an energy-efficient manner, since the analysis device does not need to work continuously. Finally, an event-driven measurement has the advantage that an energy-efficient operation is possible, since the evaluation device does not need to work continuously, and also that the audio settings can be adapted with minimal delay. For the event-driven control it is provided that the sound reproduction comprises a sensor device, wherein the sensor device comprises, in particular, a pressure sensor and/or an acceleration sensor and/or a luminosity sensor and/or a moisture sensor and/or a GPS sensor. Thus, for example, if the acceleration sensor registers a strong acceleration and the GPS sensor detects a position in the area of a body of water, then on the basis of the presumption that the wearer has jumped into the water, an activation of the impedance measuring device and the analysis device is provided.

Provision is also made to perform the measurement of impedance values by the impedance measuring device within a range of a resonance of the loudspeaker. This allows meaningful impedance measurements to be achieved.

Furthermore, provision is made for generating a test signal with a tone generator of the sound reproduction device and for transmitting this signal to the loudspeaker, while at the same time performing a measurement of impedance values with the impedance measuring device. In this way, meaningful impedance measurements can be determined at any desired time, regardless of whether the sound reproduction device is being used.

Provision is made, in particular, to generate the test signal, in particular, for a short period of time during a pause in communication. This avoids any adverse effect on the communication due to the test signal.

Furthermore, it is provided that the test signal can be generated in a frequency range which is not perceptible by the user. This allows any distraction of the user by the test signal to be entirely avoided.

The diving goggles according to the present invention comprise a sound reproduction device. Therefore, the diving goggles have the above-mentioned advantages.

In the case of the diving goggles, there is also provision to arrange the loudspeaker of the sound reproduction device on a mask of the diving goggles or to arrange the loudspeaker of the sound reproduction device on a strap of the diving goggles.

It is further provided that the diving goggles also comprise a sound recording device, wherein the sound recording device comprises at least one microphone, which is designed, in particular, as a body contact microphone. This makes the diving goggles suitable for bi-directional communication.

Finally, there is provision for the diving goggles to be equipped with a transmitting and receiving device, wherein the sound reproduction device and the sound recording device are connected to the transmitting and receiving device. This allows the diving goggles to be integrated into a wired or wireless communication network as a subscriber.

Within the meaning of the present invention, the term "impedance" is understood to mean the measurable resistance in the operation of a loudspeaker or microphone, which is induced, in particular, by the sum of the electrical and the mechanical resistances.

The acoustic signal reproduction will change significantly between air operation and underwater operation by means of a loudspeaker of an acoustic communication device which is operated both in the air as well as under water. In the event of a change between the two media the user must manually adjust the playback volume and/or the frequency response to the respective medium in order to obtain the same listening experience. The method according to the present invention enables automatic adaptation of playback volume and/or frequency response by detection of the surrounding medium directly via a measurement of the impedance of the loudspeaker, and by an appropriately adjusted control of the amplifier and/or adaptation of the signal fed to the amplifier. To take a measurement, the impedance of the loudspeaker is measured, in particular, in the region of its resonance, because this changes significantly in this region between the operation in air and under water. In the method according to the present invention, the impedance of the loudspeaker is determined and evaluated using an evaluation unit behind the amplifier, or by an amplifier integrated in the evaluation unit. In the event of a corresponding change in the detected or measured impedance, the parameters of playback volume and/or frequency response are adapted in the signal source and/or in the amplifier to suit the respective medium.

BRIEF DESCRIPTION OF THE DRAWINGS

Additional details of the present invention are described in the drawing on the basis of exemplary embodiments shown schematically.

DETAILED DESCRIPTION OF THE INVENTION

Figure 1:
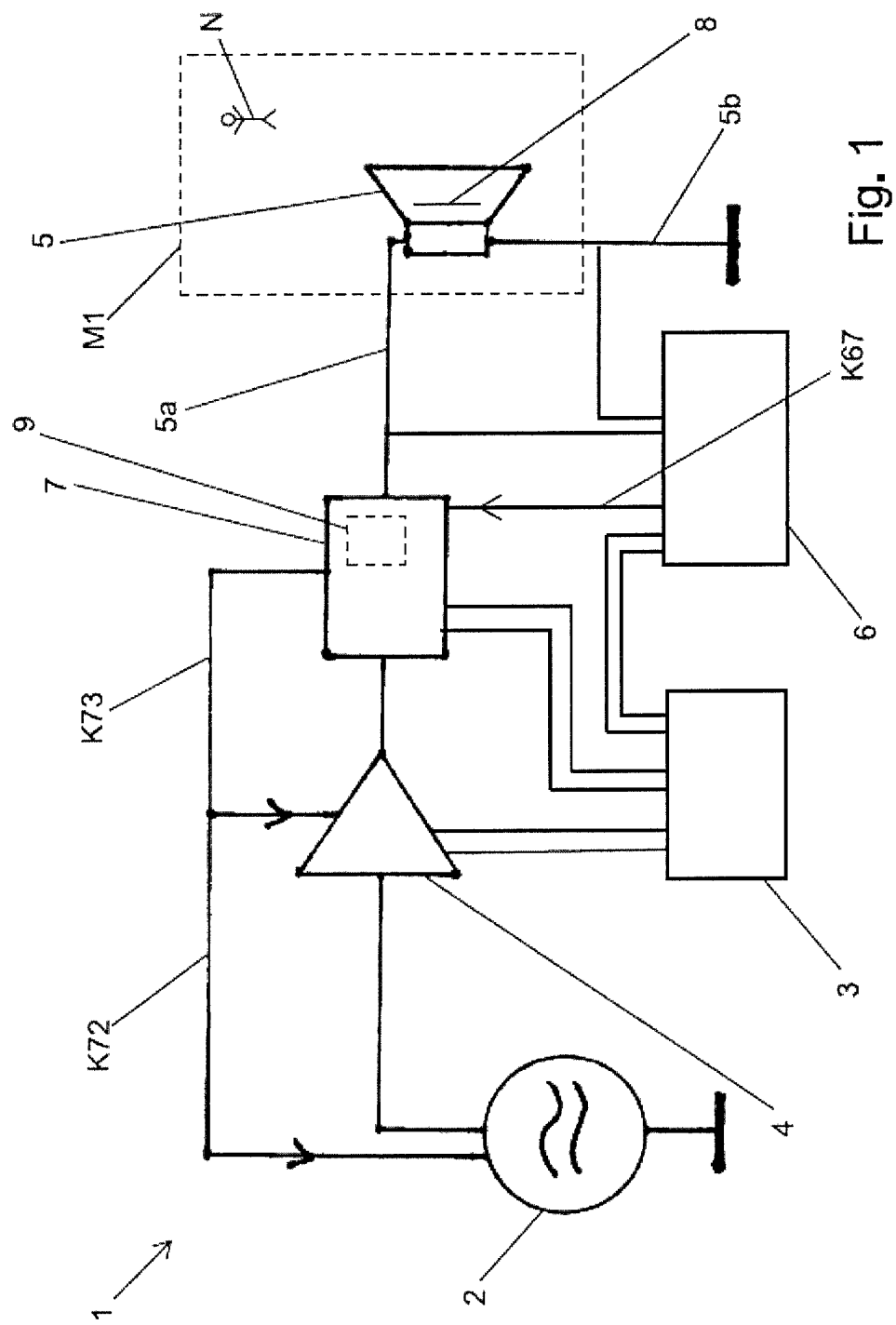
FIG. 1 is a schematic circuit diagram of a first design variant of a sound reproduction device according to the present invention.

FIG. 1 shows a schematic circuit diagram of a first design variant of a sound reproduction device 1 according to the present invention. The sound reproduction device 1 comprises a signal source 2, a power source 3, an amplifier 4, and a loudspeaker 5. The sound reproduction device 1 also comprises an impedance measuring device 6 and an analysis device 7.

In this case, the impedance measuring device 6 is connected to loudspeaker leads 5a, 5b of the loudspeaker 5 in order to measure the impedance values. The impedance measuring device 6 is connected to the analysis device 7 in order to transmit measurement results. The analysis device 7 is connected to the signal source 2 and to the amplifier 4 in order to adapt a signal fed to the loudspeaker 5. According to a design variant not shown, there is also provision to connect the analysis device 7 only to the signal source 2 or only to the amplifier 4. The power source 3 supplies the amplifier 4, the analysis device 7 and the impedance measuring device 6 with electrical energy. The loudspeaker 5 is located in a first medium M1, in which a user N of the sound reproduction device 1 is also located. Therefore, a diaphragm 8 of the loudspeaker 5 is also surrounded on both sides by the first medium M1.

In order then to adapt the sound reproduction device 1 to the medium M1, which is air, for example, to a second medium, for example, water, a measurement of at least one impedance value of the loudspeaker 5 is performed by the impedance measuring device 6. The measurement result is then forwarded via a data cable K67 to the analysis device 7. The analysis device 7 then determines, on the basis of the measurement result, the medium in which the loudspeaker is located. Then the analysis device 7 controls the signal source 2 via a data cable K72 and controls the amplifier 3 via a data cable K73, in such a way that parameters such as playback volume and/or frequency response are adapted to the detected medium in such a way that, regardless of the medium in which the loudspeaker 5 is currently being operated and in which the user N is therefore located, a consistent listening experience is ensured for the user N. The term 'consistent listening experience' is understood in the sense of the present invention to mean that both the sound volume perceived by the user is maintained and, in particular, the acoustic image perceived by the user is also maintained. The objective is to adapt the listening experience in the two media to each other in such a way that a change in medium is not apparent to the user on the basis of the sounds reproduced by the sound reproduction device, in order thus to enable an uninterrupted communication.

In accordance with one design variant, the sound reproduction device 1 comprises a tone generator 9, shown by dashed lines. By means of the tone generator 9, sound signals can be generated and transmitted to the loudspeaker 5. This means it is possible to measure impedance values of the loudspeaker 5 at individual frequencies. The tone generator 9 is arranged in the analysis device 7 and is controlled, or enabled and disabled thereby, as required.

As shown in FIG. 1, in the first medium M1 the diaphragm 8 of the loudspeaker 5 of the sound reproduction device 1 is bounded by the medium on both sides.

Figure 2:
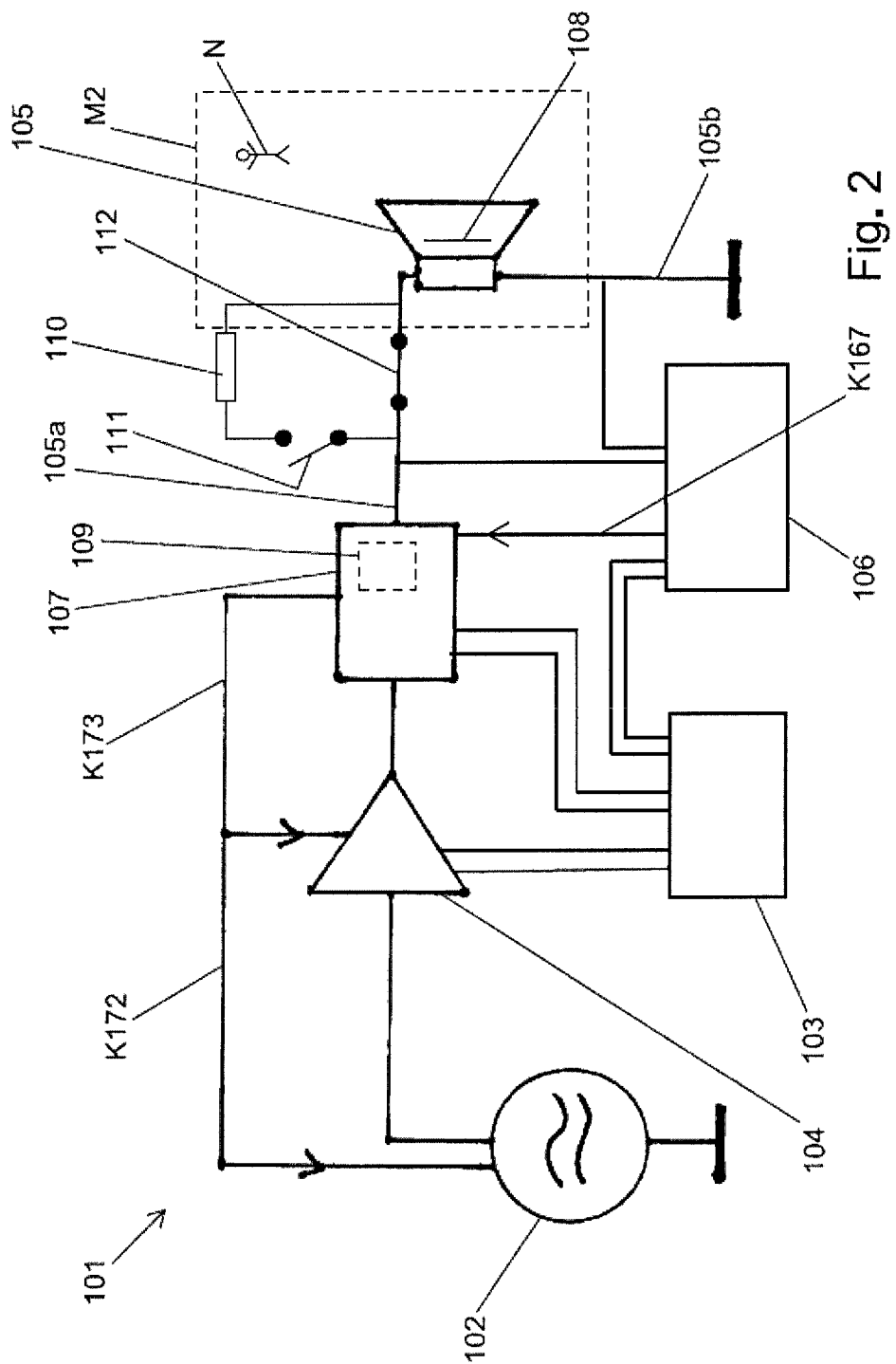
FIG. 2 is a schematic circuit diagram of a second design variant of a sound reproduction device according to the present invention.

FIG. 2 shows a schematic circuit diagram of a second design variant of a sound reproduction device 101 according to the present invention. With regard to the fundamental structure of the sound reproduction device 101, reference is made to the description of the sound reproduction device shown in FIG. 1, wherein the reference numerals for the components shown in FIG. 2 are each increased by 100. In contrast to the sound reproduction device shown in FIG. 1, the loudspeaker 105 of the sound reproduction device 101 shown in FIG. 2 is located in a second medium M2, which is formed by water and is different from the first medium M1 with regard to its density. The sound reproduction device 101 comprises a series resistance 110, wherein the series resistance 110 is connected upstream of the loudspeaker 105 when measuring impedance values with the impedance measuring device 106. For this purpose, a first switch 111 shown in the open position is then closed and a second switch 112, shown in the closed position, is then opened. The medium M2 also surrounds the diaphragm 108 of the loudspeaker 105 on all sides.

Figure 3:
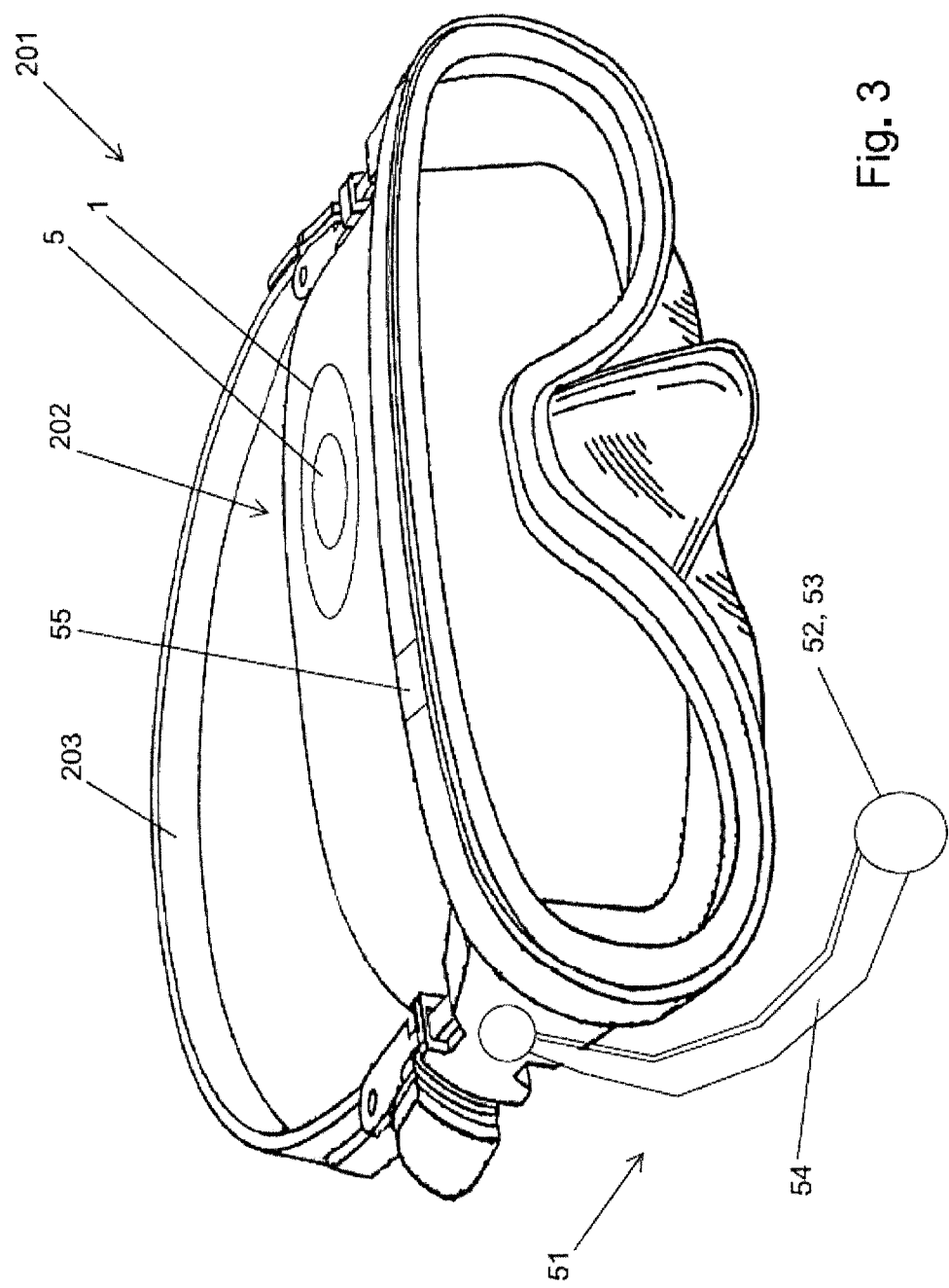
FIG. 3 is a pair of diving goggles according to the present invention.

In FIG. 3, a pair of diving goggles 201 according to the present invention is shown schematically in a perspective view. The goggles 201 comprise a sound reproduction device 1 as shown and described in FIG. 1. In this figure, the sound reproduction device 1 is only shown schematically in the area of a mask 202 of the diving goggles 201, wherein the loudspeaker 5 is also illustrated schematically and is arranged on the mask 202 of the diving goggles 201.

The diving goggles 201 also comprise a sound recording device 51. The sound recording device 51 is arranged in an area of the mask 202, in which one end of a strap of the goggles 203 is attached to the mask 202. This comprises a microphone 52, which is implemented as a body contact microphone 53 and is arranged on a flexible arm 54 in such a way that it can be placed on a body of a user, not shown.

The diving goggles 201 and/or the sound reproduction device 1 and the sound recording device 51 comprises or comprise a transmitting and receiving device 55. In this case, the sound reproduction device 1 and the sound recording device 51 are connected to the transmitting and receiving device 55, so that voice signals can be transmitted and received wirelessly via this device. Of course, the sound reproduction device 1 and the sound recording device 51 are connected to each other via data cables, not shown.

The components of sound reproduction device 1, sound recording device 51 and transmitting and receiving device 55 form an acoustic communication device 301 independently of the goggles 201.

LIST OF REFERENCE NUMERALS 1 sound reproduction device
2 signal source
3 power source
4 amplifier
5 loudspeaker
5a, 5b loudspeaker lead
6 impedance measuring device
7 analysis device
8 diaphragm of 5
9 tone generator
51 sound recording device
52 microphone
53 body contact microphone
54 flexible arm of 51
55 transmitting and receiving device
101 sound reproduction device
102 signal source
103 power source
104 amplifier
105 loudspeaker
105a loudspeaker lead
105b loudspeaker lead
106 impedance measuring device
107 analysis device
108 diaphragm of 5
109 tone generator
110 series resistance
111 first switch
112 second switch
201 diving goggles
202 mask of 201
203 goggles strap
301 communication device
K67 data cable between 6 and 7
K72 data cable between 7 and 2
K73 data cable between 7 and 3
K167 data cable between 106 and 107
K172 data cable between 107 and 102
K173 data cable between 107 and 103
M1 first medium, air
M2 second medium, water
N user

The invention claimed is:

1. A method for adapting a sound reproduction device, which comprises a signal source, a power source, an amplifier and a loudspeaker, to different environmental media such as air and water, wherein by means of an impedance measuring device a measurement of at least one impedance value of the loudspeaker is performed, wherein a measurement result is forwarded to an analysis device, wherein from the measurement result the medium, in which the loudspeaker is located, is determined by the analysis device, wherein at least one of the signal source or the amplifier is controlled by the analysis device in such a manner that at least one of reproduction volume or frequency response is adapted to the detected medium in such a way that regardless of the medium in which the loudspeaker is operated, a consistent listening experience is ensured for a user.

2. The method as claimed in claim 1, wherein the at least one impedance value is measured by the impedance measuring device continuously, or the at least one impedance value is measured by the impedance measuring device at intervals, or the at least one impedance value is measured by the impedance measuring device in an event-driven manner.

3. The method as claimed in claim 1, wherein the measurement of the at least one impedance value by the impedance measuring device is performed in a region of a resonance of the loudspeaker.

4. The method as claimed in claim 1, wherein a test signal is generated by a tone generator of the sound reproduction device and transmitted to the loudspeaker, and at the same time the measurement of the at least one impedance value is carried out with the impedance measuring device.

5. The method as claimed in claim 4, wherein the test signal is generated during a communication pause.

6. The method as claimed in claim 4, wherein the test signal is generated in a frequency range which is not perceptible by the user.

* * * * *